US011888129B2

(12) United States Patent
Petersen et al.

(10) Patent No.: US 11,888,129 B2
(45) Date of Patent: Jan. 30, 2024

(54) BATTERY CELL WEAR INDICATOR

(71) Applicant: Lenovo (United States) Inc., Morrisville, NC (US)

(72) Inventors: John M Petersen, Wake Forest, NC (US); Bouziane Yebka, Apex, NC (US); Gary D Cudak, Wake Forest, NC (US); Nathan Peterson, Oxford, NC (US)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 113 days.

(21) Appl. No.: 17/490,827

(22) Filed: Sep. 30, 2021

(65) Prior Publication Data

US 2023/0100428 A1 Mar. 30, 2023

(51) Int. Cl.
*H01M 10/48* (2006.01)
*G08B 21/18* (2006.01)
*G01R 31/392* (2019.01)
*H01M 10/42* (2006.01)
*H01M 50/204* (2021.01)

(52) U.S. Cl.
CPC ........ *H01M 10/488* (2013.01); *G01R 31/392* (2019.01); *G08B 21/182* (2013.01); *H01M 10/4257* (2013.01); *H01M 10/482* (2013.01); *H01M 50/204* (2021.01); *H01M 2010/4271* (2013.01); *H01M 2010/4278* (2013.01)

(58) Field of Classification Search
CPC .......... H01M 10/488; H01M 10/4257; H01M 10/482; H01M 2010/4271; G01R 31/392
See application file for complete search history.

(56) References Cited

U.S. PATENT DOCUMENTS

| | | | |
|---|---|---|---|
| 2016/0195437 A1* | 7/2016 | Georgeson ........... | G01K 11/125 374/162 |
| 2018/0337560 A1* | 11/2018 | Beckman ................ | H02J 50/80 |
| 2021/0135473 A1* | 5/2021 | Wigney ................ | H01M 10/48 |

\* cited by examiner

*Primary Examiner* — Benyam Haile
(74) *Attorney, Agent, or Firm* — Ference & Associates LLC

(57) ABSTRACT

One embodiment provides a method, including: monitoring, using a battery management unit, a condition of one or more cells within a block of a battery, wherein the monitoring comprises capturing, using a camera associated with the battery management unit, an image of an exterior of the one or more cells; determining, using a processor, that the condition of at least one of the one or more cells has fallen below a predetermined threshold, wherein the determining comprises identifying that the exterior of the at least one of the one or more cells has undergone a color change event; and providing, responsive to the determining, a notification. Other aspects are described and claimed.

18 Claims, 4 Drawing Sheets

BATTERY CELL WEAR INDICATOR

BACKGROUND

Virtually all mobile electronic devices ("devices"), for example smart phones, tablets, laptop computers, and the like, draw energy from one or more integrated batteries when not connected to a power source. After a prolonged period of use, these batteries age and lose their effectiveness. When the battery is dead and/or no longer able to effectively supply power to a device it must be replaced.

BRIEF SUMMARY

In summary, one aspect provides a method, including: monitoring, using a battery management unit, a condition of one or more cells within a block of a battery, wherein the monitoring comprises capturing, using a camera associated with the battery management unit, an image of an exterior of the one or more cells; determining, using a processor, that the condition of at least one of the one or more cells has fallen below a predetermined threshold, wherein the determining comprises identifying that the exterior of the at least one of the one or more cells has undergone a color change event; and providing, responsive to the determining, a notification.

Another aspect provides an electronic device, including: a battery management unit; a processor; a memory device that stores instructions executable by the processor to: monitor, using the battery management unit, a condition of one or more cells within a block of a battery, wherein the monitoring comprises capturing, using a camera associated with the battery management unit, an image of an exterior of the one or more cells; determine that the condition of at least one of the one or more cells has fallen below a predetermined threshold, wherein the determining comprises identifying that the exterior of the at least one of the one or more cells has undergone a color change event; and provide, responsive to the determining, a notification.

A further aspect provides a battery, including: at least one block comprising a plurality of cells; wherein an exterior of each of the plurality of cells is coated with a thermochromic material designed to undergo a color change event responsive to a cell condition falling below a predetermined threshold.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the invention will be pointed out in the appended claims.

DETAILED DESCRIPTION

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

Figure 1:
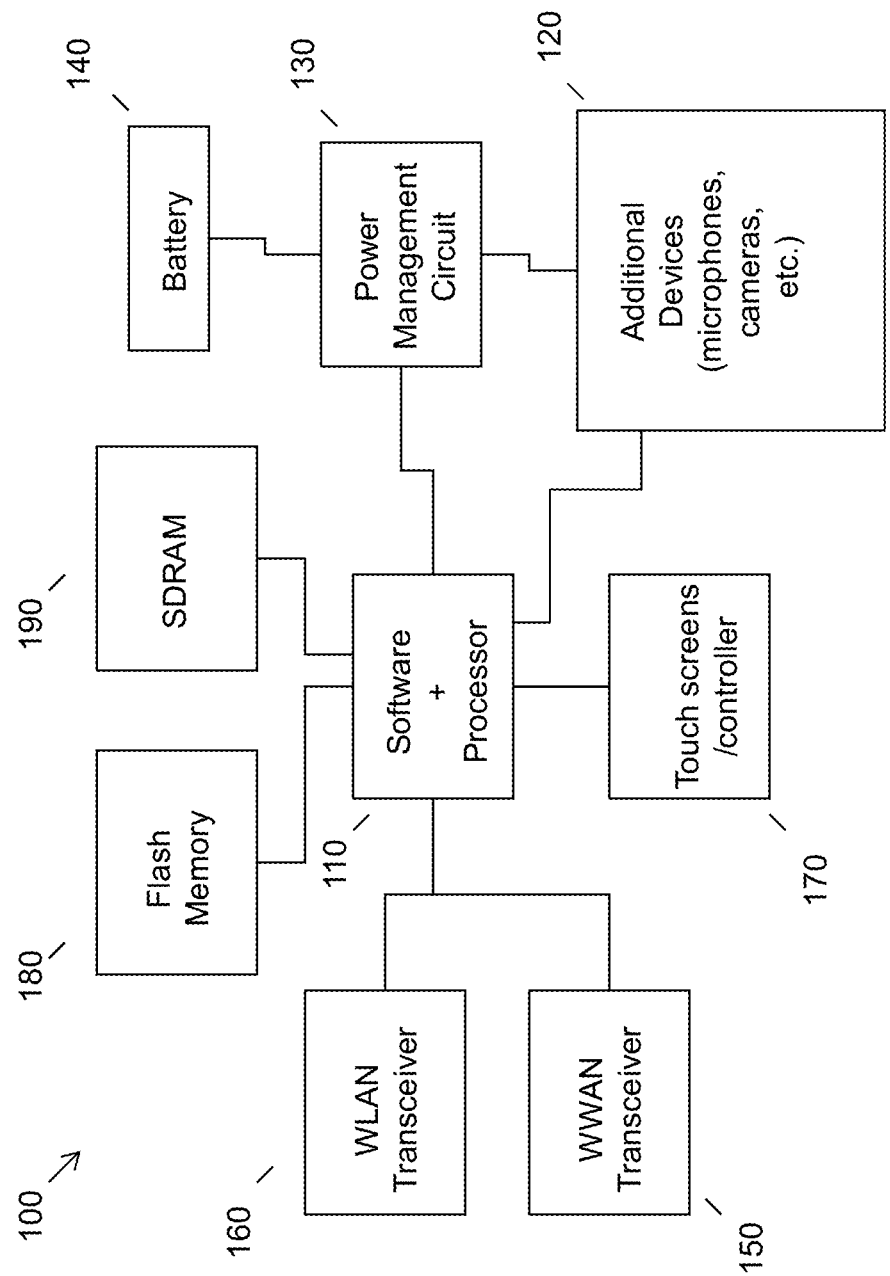
FIG. 1 illustrates a prior art configuration of battery cells in a block of a battery.

Nearly all mobile technology today depends on stored energy from chemical batteries. These batteries are composed of one or more battery blocks that each contains multiple battery cells (e.g., lithium-ion (Li-ion) cell, etc.) assembled in serial and in parallel. As an example of the foregoing and with reference to FIG. 1, a conventional battery block containing a plurality of connected cells is illustrated.

As the battery ages, the individual cells within the battery block may wear down at different rates. A battery with single or multiple bad cells or blocks may be unable to effectively provide power to a device even if the remaining cells are still in good working condition. Although it is possible to replace a defective cell within the battery block, conventional methods for identifying the defective cell must be conducted manually. More particularly, an individual must test each individual cell in the block to identify the defective one. Such a process may be extremely time-consuming and burdensome, especially if a single block contains many hundreds of connected cells.

Accordingly, an embodiment provides a method of providing quality indications on the exterior of individual cells within a battery block. Such indications may aid in the identification of defective cells and/or may be useful in the reuse of cells or blocks from dead batteries. In an embodiment, the exterior of each of the cells within a battery block may be coated with some type of thermochromic material (e.g., heatsensitive temperature gauge, smart inks, etc.). When this material is activated (e.g., from a change in voltage, heat/temperature, impedance, etc. passed a designed threshold), an on-demand persistent and visible state change may occur (i.e., the color of the thermochromic coating may change). This color change may enable a user or device (e.g., a battery management unit, etc.) to quickly identify the defective cell from within a batch of healthy cells.

The illustrated example embodiments will be best understood by reference to the figures. The following description is intended only by way of example, and simply illustrates certain example embodiments.

Figure 2:
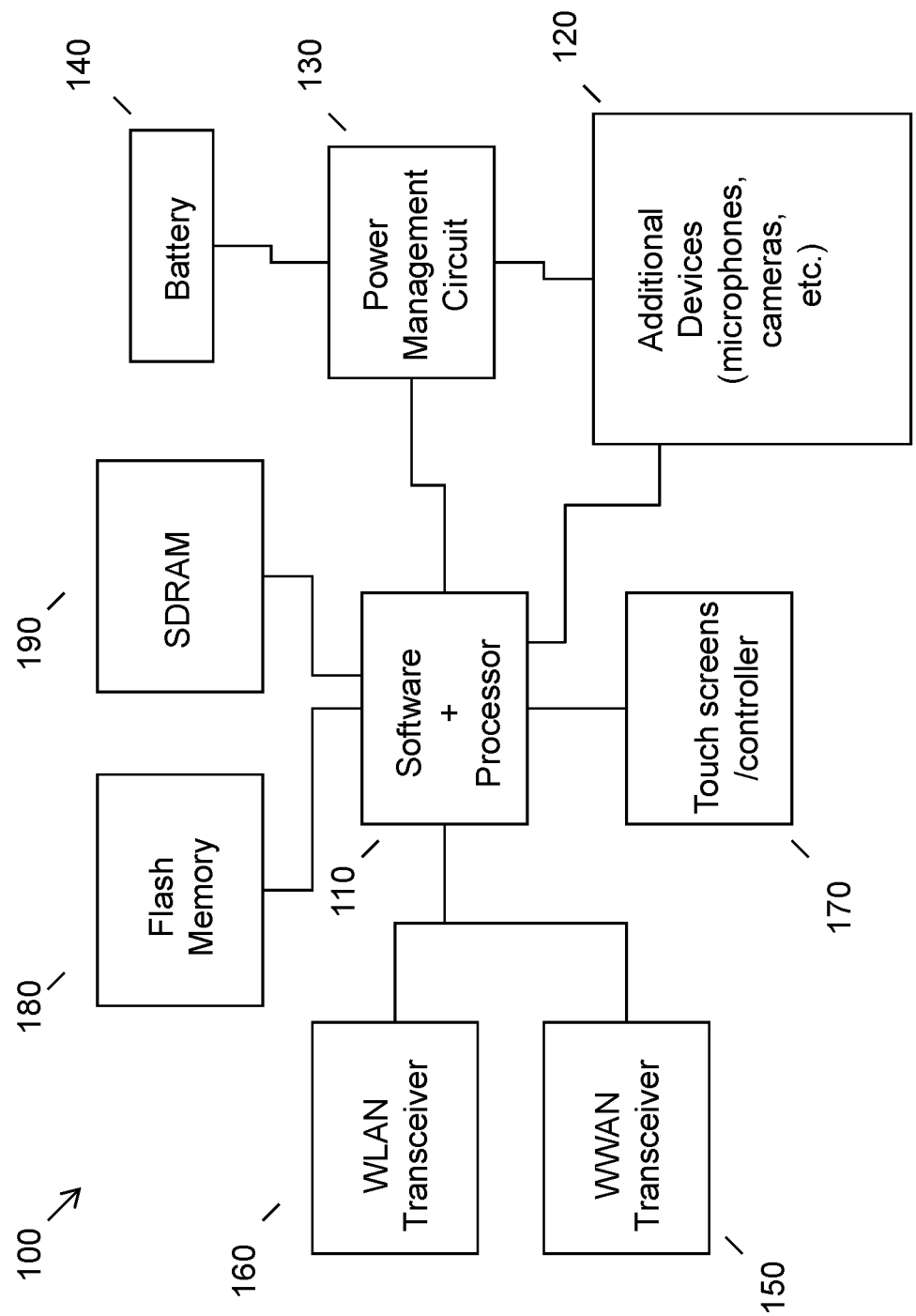
FIG. 2 illustrates another example of information handling device circuitry.

FIG. 2 depicts a block diagram of another example of information handling device circuits, circuitry or components. The example depicted in FIG. 2 may correspond to computing systems such as the THINKPAD series of personal computers sold by Lenovo (US) Inc. of Morrisville, NC, or other devices. As is apparent from the description herein, embodiments may include other features or only some of the features of the example illustrated in FIG. 2.

The example of FIG. 2 includes a so-called chipset 210 (a group of integrated circuits, or chips, that work together, chipsets) with an architecture that may vary depending on manufacturer (for example, INTEL, AMD, ARM, etc.). INTEL is a registered trademark of Intel Corporation in the United States and other countries. AMD is a registered trademark of Advanced Micro Devices, Inc. in the United States and other countries. ARM is an unregistered trademark of ARM Holdings plc in the United States and other countries. The architecture of the chipset 210 includes a core and memory control group 220 and an I/O controller hub 250 that exchanges information (for example, data, signals, commands, etc.) via a direct management interface (DMI) 242 or a link controller 244. In FIG. 2, the DMI 242 is a chip-to-chip interface (sometimes referred to as being a link between a "northbridge" and a "southbridge"). The core and memory control group 220 include one or more processors 222 (for example, single or multi-core) and a memory controller hub 226 that exchange information via a front side bus (FSB) 224; noting that components of the group 220 may be integrated in a chip that supplants the conventional "northbridge" style architecture. One or more processors 222 comprise internal arithmetic units, registers, cache memory, busses, I/O ports, etc., as is well known in the art.

In FIG. 2, the memory controller hub 226 interfaces with memory 240 (for example, to provide support for a type of RAM that may be referred to as "system memory" or "memory"). The memory controller hub 226 further includes a low voltage differential signaling (LVDS) interface 232 for a display device 292 (for example, a CRT, a flat panel, touch screen, etc.). A block 238 includes some technologies that may be supported via the LVDS interface 232 (for example, serial digital video, HDMI/DVI, display port). The memory controller hub 226 also includes a PCI-express interface (PCI-E) 234 that may support discrete graphics 236.

In FIG. 2, the I/O hub controller 250 includes a SATA interface 251 (for example, for HDDs, SDDs, etc., 280), a PCI-E interface 252 (for example, for wireless connections 282), a USB interface 253 (for example, for devices 284 such as a digitizer, keyboard, mice, cameras, phones, microphones, storage, other connected devices, etc.), a network interface 254 (for example, LAN), a GPIO interface 255, a LPC interface 270 (for ASICs 271, a TPM 272, a super I/O 273, a firmware hub 274, BIOS support 275 as well as various types of memory 276 such as ROM 277, Flash 278, and NVRAM 279), a power management interface 261, a clock generator interface 262, an audio interface 263 (for example, for speakers 294), a TCO interface 264, a system management bus interface 265, and SPI Flash 266, which can include BIOS 268 and boot code 290. The I/O hub controller 250 may include gigabit Ethernet support.

The system, upon power on, may be configured to execute boot code 290 for the BIOS 268, as stored within the SPI Flash 266, and thereafter processes data under the control of one or more operating systems and application software (for example, stored in system memory 240). An operating system may be stored in any of a variety of locations and accessed, for example, according to instructions of the BIOS 268. As described herein, a device may include fewer or more features than shown in the system of FIG. 2.

Information handling circuitry, as for example outlined in FIG. 2, may be utilized to help facilitate the identification of the condition of one or more battery cells. For example, the circuitry outlined in FIG. 2 may be implemented in a laptop or personal computer or may be circuitry that is embodied in a dedicated device that specifically utilized to identify battery cell condition.

Figure 3:
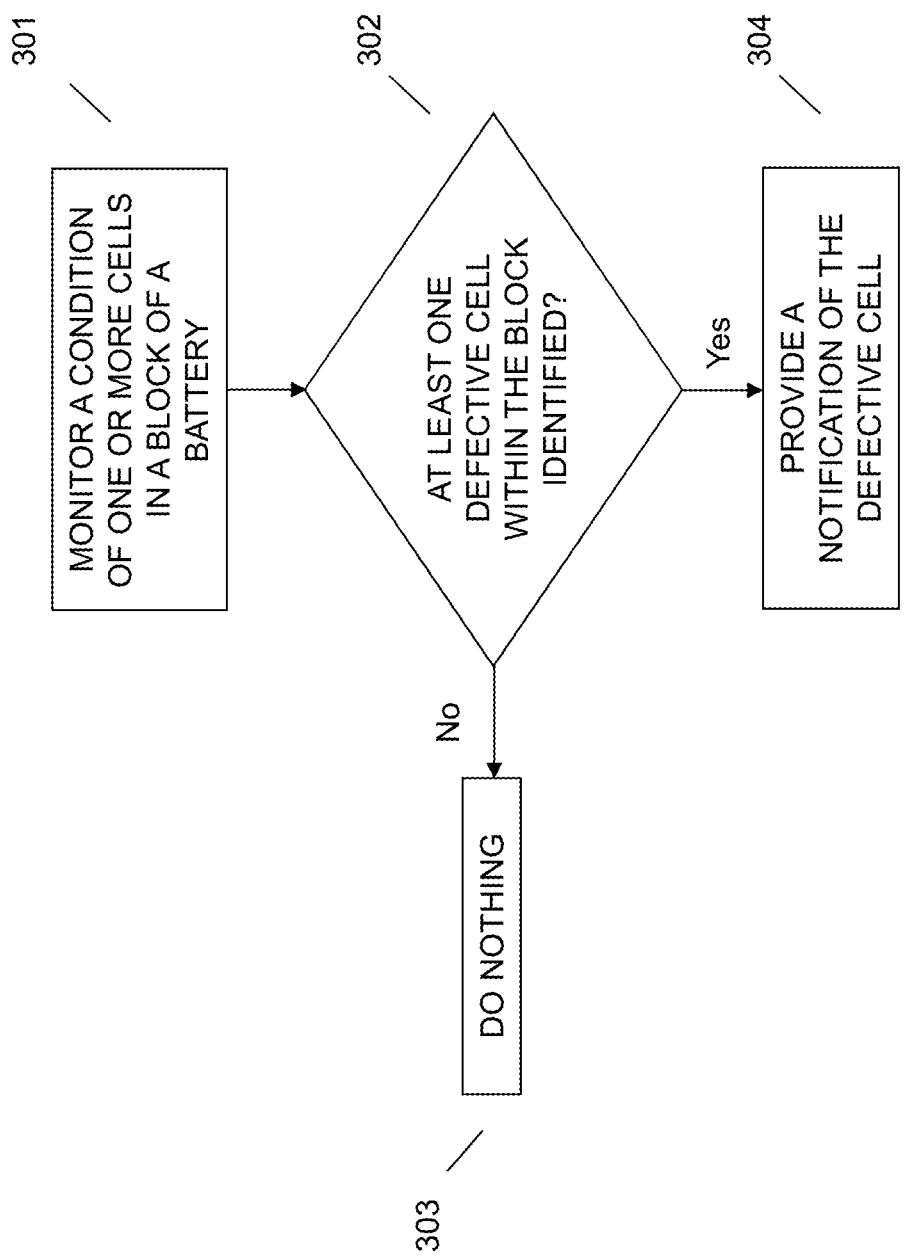
FIG. 3 illustrates an example method of identifying defective cells within a block of a battery.

Referring now to FIG. 3, an embodiment provides a method for identifying defective cells within a battery. At 301, an embodiment may monitor a condition of one or more cells within a block of a battery. In the context of this application, the condition of a cell refers to its ability to function properly. A cell that functions below a predetermined threshold of operation is considered to be one that is defective. In an embodiment, the exterior surface of each of the cells may be covered with a thermochromic material (i.e., a temperature-sensitive material that can change color from exposure to heat). Non-limiting examples of acceptable types of thermochromic materials include: thermochromic tape adhered to the exterior surface of the cell or thermochromic paints or dyes that the exterior surface of the cell can be coated with.

In an embodiment, the thermochromic material may be designed to initiate the color-state change at a predetermined threshold based upon one or more aspects of the battery cell. For example, the thermochromic material may change color based upon the heat generated from an applied voltage and/or current cycle during an active inspection period, as further described below. In an embodiment, the design of the thermochromic material material (i.e., the chemical composition of the material) may dictate the threshold at which such a visible state change occurs. Stated differently, the thermochromic material may be designed to undergo a state change at a particular temperature. In the instant case, the thermochromic material may be designed to undergo a state change in response to detecting a temperature that is known to be associated with battery overheating.

In an embodiment, the monitoring process may occur during a dedicated active inspection period. This period may be a time during which the voltage and/or current of one or more cells is intentionally cycled (i.e., charged and discharged) for a short period of time (e.g., a few seconds, a few minutes, etc.). Healthy operational cells may be substantially unaffected during this process. More particularly, the heat emitted from healthy cells during the charge/discharge cycle may not be sufficient (i.e., the heat will not be high enough) to produce the visible state change on the thermochromic coating of the cell. Conversely, defective cells that no longer operate effectively may heat up quicker and to higher temperatures than operational cells (e.g., due to overwork to maintain a charge). The heat emitted from these defective cells may be enough to activate the color change properties of the thermochromic material.

In an embodiment, the monitoring process may be conducted manually (i.e., by a human user) or automatically by a battery management unit (BMU). With respect to the former, a human user may manually modulate the voltage and/or current in each cell and then monitor to see if a color change occurs to determine which cells are defective and which cells are operational. With respect to the latter, the BMU may be configured to automatically apply a voltage and/or current modulation to the cells. In an embodiment, the BMU may be a dedicated cell-condition monitoring device or, alternatively, the BMU may be a component integrated within a larger device. In an embodiment, the BMU may contain one or more cameras that are capable of capturing images of the cell surface. In an embodiment, the images of the cells may be taken at predetermined intervals during the active inspection period (e.g., a predetermined time after the voltage and/or current modulation has been applied, etc.) or may be taken in response to predetermined events (e.g., an explicit user command to take a picture of the cell, etc.).

At 302, an embodiment may determine that the condition of at least one cell in the block has fallen below a predetermined threshold. In an embodiment, the determination may be facilitated by identifying that the exterior of one or more cells in the block has undergone a color change event. More particularly, an embodiment may analyze the captured image in step 301 (e.g., using one or more image analysis techniques known in the art, etc.) to determine whether the image contains the presence of a specific color. In this regard, an embodiment may access a ruleset in a database (e.g., stored locally on the device or stored remotely on another device or server, etc.) that designates which color is associated with a defective battery. The choice of color for the defective battery may be user-driven and may be based on the characteristics and design of the thermochromic material. Responsive to identifying that the color is present in the image, an embodiment may conclude that at least one cell in the block is defective. An embodiment may further record the identity of the cell (i.e., its position in the cell block) which may later be provided to a user in a notification, as further described below.

Figure 4C:
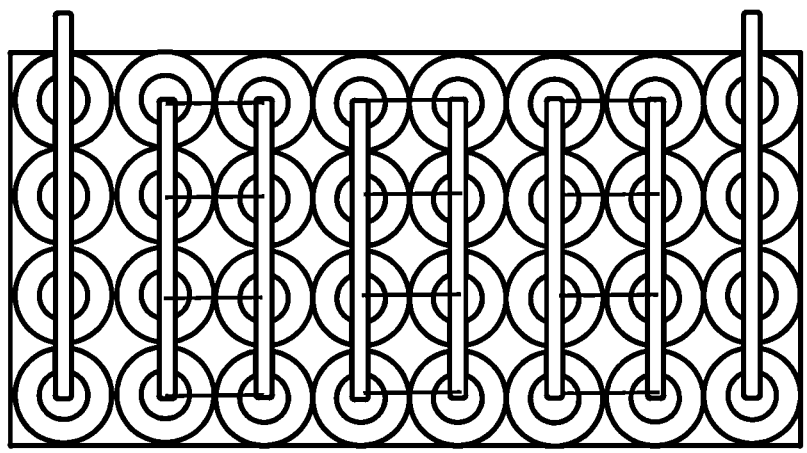
FIG. 4(A-C) provides an example illustration of how defective cells may be identified in a block of a battery over time.
Figure 4B:
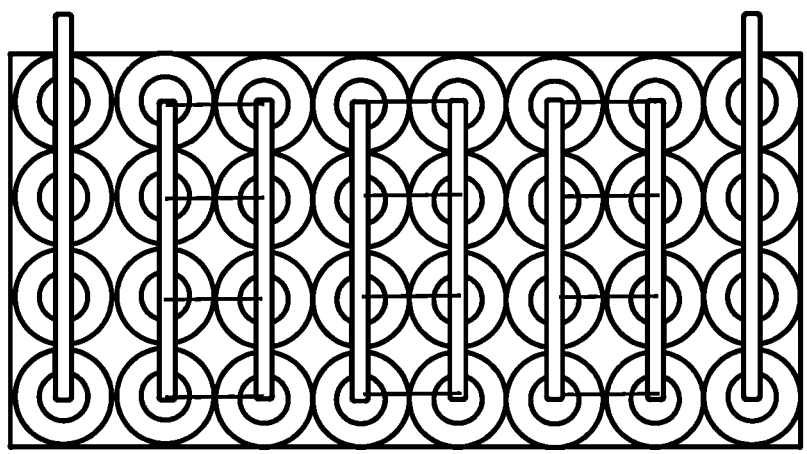
Figure 4A:
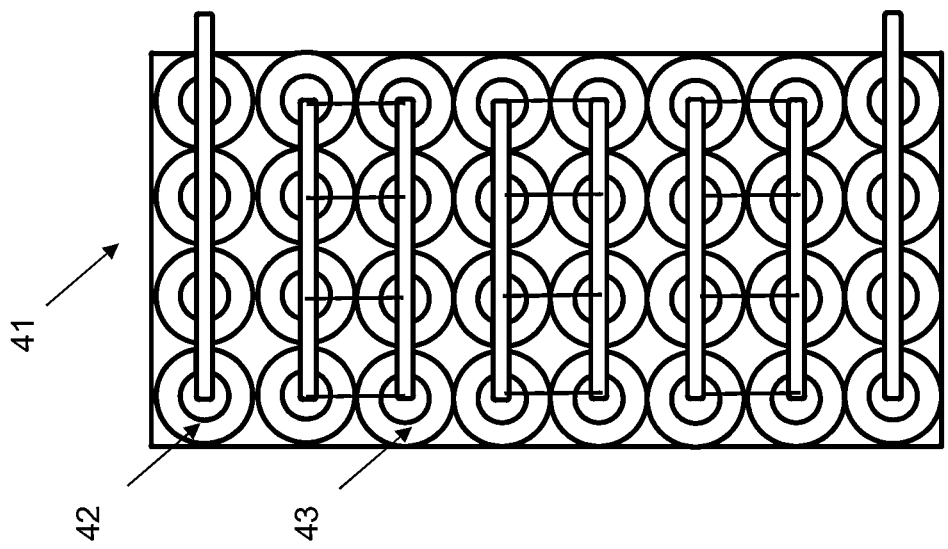

Referring now to FIG. 4(A-C), a plurality of illustrations of a single cell block within a battery at different times are provided. In each illustration, a cell block 41 is provided that contains a plurality of operational cells 42 (i.e., unshaded cells) and defective cells 43 (i.e., shaded cells). As the battery continues to age (i.e., as more charge and discharge cycles occur), as illustrated from FIG. 4A to FIG. 4C, a greater number of operational cells 42 become defective 43. The defective cells 43 are easily identifiable to a user or to a device based upon their visible differences from the operational cells 42.

Responsive to determining, at 302, that no color change event has occurred, an embodiment may, at 303, take no additional action. Conversely, responsive to determining, at 302, that the color change event has occurred, an embodiment may, at 304, provide a notification. In an embodiment, the provision of the notification may occur automatically (i.e., without the receipt of any additional user input).

In an embodiment, the notification may be provided to one or more designated devices. The designated devices may be initially established by a manufacturer but may later be changed by a user. In an embodiment, virtually any device capable of receiving notifications may be designated to receive the notification (e.g., a user's device, an administrator's device, etc.). In an embodiment, the notification may contain an indication that one or more cells in a battery are defective. In an embodiment, the notification may specify the number of defective cells in a battery block and/or the locations of the defective cells within the battery block. Additionally or alternatively, the notification may contain the captured image of the battery block. In this situation, the user may be apprised of which cells are defective simply based on a visual inspection of the image (i.e., a user can easily identify which of the cells are different colors than the rest).

In an embodiment, the BMU may further be configured to write additional information onto the exterior surface of the cells. The BMU may contain a writing means that can print such information onto the cell. The additional information may include: a marking of battery chemistry, a date of cell block formation, a date of last inspection, and a date of defective cell identification. Additionally or alternatively, an intelligence solution may be incorporated into the BMU firmware where information associated with each cell's temperature is monitored and compared to the expected behavior of the cell based on the applied current and voltage. Utilizing this techniques, defective cells may be identified without ever opening the battery pack.

The various embodiments described herein thus represent a technical improvement to conventional techniques for identifying defective cells within a battery. Using the techniques described herein, an embodiment may monitor, using a battery management unit and during an active inspection period, the condition of cells within a battery block. Each of the cells may be coated with a thermochromic material that is designed to change color based upon heat emitted from a battery. An embodiment may distinguish defective cells from operational cells by identifying the color changes on the exterior surface of the battery. Responsive to making these distinctions, an embodiment may provide a notification corresponding to the defective cell identification. Such techniques may simplify the recycling process of battery cells and may also extend the usability of the battery beyond its originally intended application.

As used herein, the singular "a" and "an" may be construed as including the plural "one or more" unless clearly indicated otherwise.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

What is claimed is:

1. A method, comprising:
   monitoring, using a battery management unit, a condition of one or more cells within a block of a battery, wherein the monitoring comprises capturing, using a camera associated with the battery management unit, an image of an exterior of the one or more cells;
   determining, using a processor, that the condition of at least one of the one or more cells has fallen below a predetermined threshold, wherein the determining comprises identifying that the exterior of the at least one of the one or more cells has undergone a color change event; and
   providing, responsive to the determining, a notification, wherein the providing a notification comprises writing, using the battery management unit, information onto the exterior of the one or more cells.

2. The method of claim 1, wherein the exterior of each of the one or more cells are coated with a thermochromic material.

3. The method of claim 2, wherein the thermochromic material is selected from the group consisting of: a thermochromic tape, a thermochromic paint, and a thermochromic dye.

4. The method of claim 2, wherein the thermochromic material is designed to undergo the color change event at a predetermined temperature threshold.

5. The method of claim 1, wherein initiation of the color change event is facilitated by a change in temperature in response to an applied variation to voltage and current of the one or more cells.

6. The method of claim 5, wherein the applied variation is introduced during a designated active inspection period.

7. The method of claim 1, wherein the providing the notification comprises providing the notification to at least one other device.

8. The method of claim 1, wherein the notification comprises an indication of which of the one or more cells in the block has fallen below the predetermined threshold.

9. The method of claim 1, wherein the battery management unit is integrated within an information handling device.

10. An electronic device, comprising:
a battery management unit;
a processor;
a memory device that stores instructions executable by the processor to:
monitor, using the battery management unit, a condition of one or more cells within a block of a battery, wherein the monitoring comprises capturing, using a camera associated with the battery management unit, an image of an exterior of the one or more cells;
determine that the condition of at least one of the one or more cells has fallen below a predetermined threshold, wherein the determining comprises identifying that the exterior of the at least one of the one or more cells has undergone a color change event; and
provide, responsive to the determining, a notification, wherein the providing a notification comprises writing, using the battery management unit, information onto the exterior of the one or more cells.

11. The electronic device of claim 10, wherein the exterior of each of the one or more cells are coated with a thermochromic material.

12. The electronic device of claim 11, wherein the thermochromic material is selected from the group consisting of: a thermochromic tape, a thermochromic paint, and a thermochromic dye.

13. The electronic device of claim 11, wherein the thermochromic material is designed to undergo the color change event at a predetermined temperature threshold.

14. The electronic device of claim 10, wherein initiation of the color change event is facilitated by a change in temperature in response to an applied variation to voltage and current of the one or more cells.

15. The electronic device of claim 14, wherein the applied variation is introduced during a designated active inspection period.

16. The electronic device of claim 10, wherein the instructions executable by the processor to provide the notification comprise instructions executable by the processor to provide the notification to at least one other device.

17. The electronic device of claim 10, wherein the notification comprises an indication of which of the one or more cells in the block has fallen below the predetermined threshold.

18. A battery, comprising:
at least one block comprising a plurality of cells;
wherein an exterior of each of the plurality of cells is coated with a thermochromic material designed to undergo a color change event responsive to a cell condition falling below a predetermined threshold;
wherein, upon a cell condition falling below the predetermined threshold, a battery management unit writes information onto the exterior of the one or more cells.

* * * * *